(12) United States Patent
Sakai et al.

(10) Patent No.: US 7,381,643 B2
(45) Date of Patent: Jun. 3, 2008

(54) WIRING STRUCTURE FORMING METHOD AND SEMICONDUCTOR DEVICE

(75) Inventors: Hisaya Sakai, Kawasaki (JP); Noriyoshi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 125 days.

(21) Appl. No.: 11/407,920

(22) Filed: Apr. 21, 2006

(65) Prior Publication Data

US 2006/0189115 A1 Aug. 24, 2006

Related U.S. Application Data

(63) Continuation of application No. PCT/JP2005/000191, filed on Jan. 11, 2005.

(30) Foreign Application Priority Data

Jan. 8, 2004 (JP) ............... 2004-003383

(51) Int. Cl.
*H01L 21/44* (2006.01)
*H01L 23/52* (2006.01)

(52) U.S. Cl. ..................... 438/653; 257/751

(58) Field of Classification Search ............ 438/627, 438/643, 653, 680, 695, 965; 257/652, 751, 257/E23.015–E23.079, E21.537–E21.539
See application file for complete search history.

(56) References Cited

U.S. PATENT DOCUMENTS

2002/0072226 A1 6/2002 Ueno

FOREIGN PATENT DOCUMENTS

| JP | 2003-193300 | 7/2003 |
|---|---|---|
| JP | 2003-282703 | 10/2003 |
| JP | 2003-303882 | 10/2003 |
| JP | 2004-153162 | 5/2004 |

OTHER PUBLICATIONS

International Search Report of International Application PCT/JP2005/000191 filed Jan. 11, 2005.
Notification of Transmittal of Translation of the International Preliminary Report on Patentability (Form PCT/IB/338) of International Application No. PCT/JP2005/000191 mailed Aug. 31, 2006 with Forms PCT/IB/373 and PCT/ISA/237.

*Primary Examiner*—Calvin Lee
(74) *Attorney, Agent, or Firm*—Westerman, Hattori, Daniels & Adrian, LLP.

(57) ABSTRACT

After a via hole (102) to connect a lower wiring (101) and an upper wiring not shown is formed in an insulating film (103) using an etching stopper film (104) and a hard mask (105), a base film (106) made from Ta is formed over the insulating film (103) so as to cover an inner wall of the via hole (102) by a one-step low-power bias sputtering method of the present invention. Thus, the base film (106) with a thin and uniform film thickness covering a region from an inner wall surface of the via hole (102) to the insulating film (103) is obtained. This makes it possible to form the base film thin and uniformly over the inner wall surface, that is, from a sidewall surface to a bottom surface, of the opening without causing any disadvantage in terms of wiring formation by relatively simple steps, thereby realizing a highly reliable ultra-fine wiring structure.

16 Claims, 13 Drawing Sheets

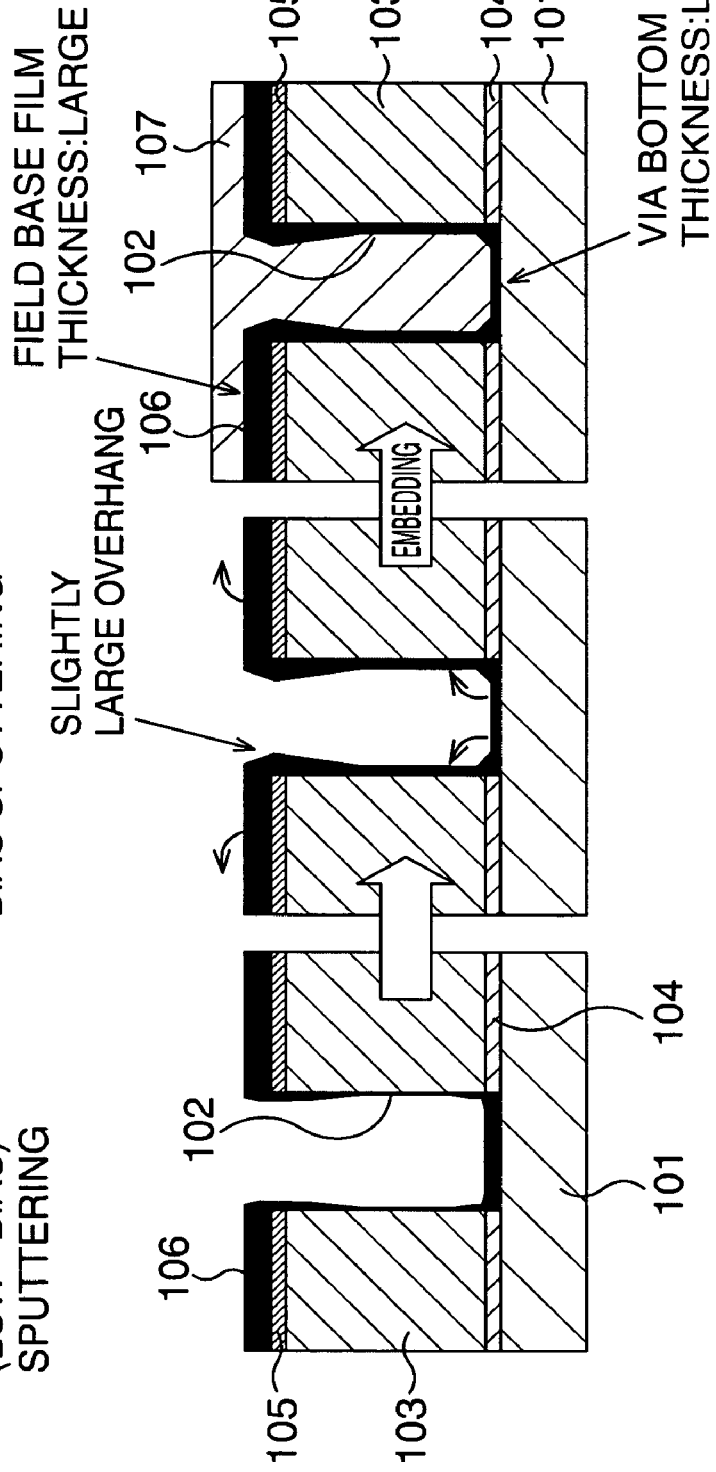

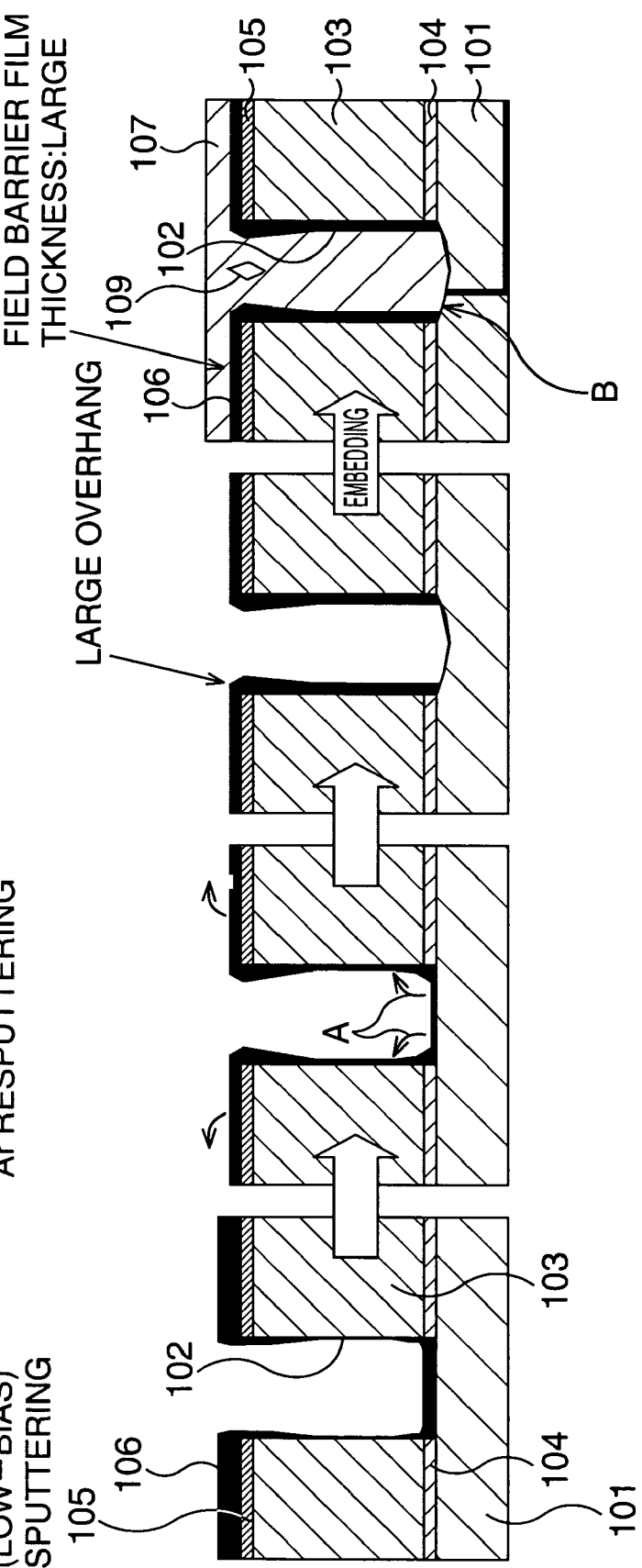

ONE-STEP LOW-POWER FILM FORMATION

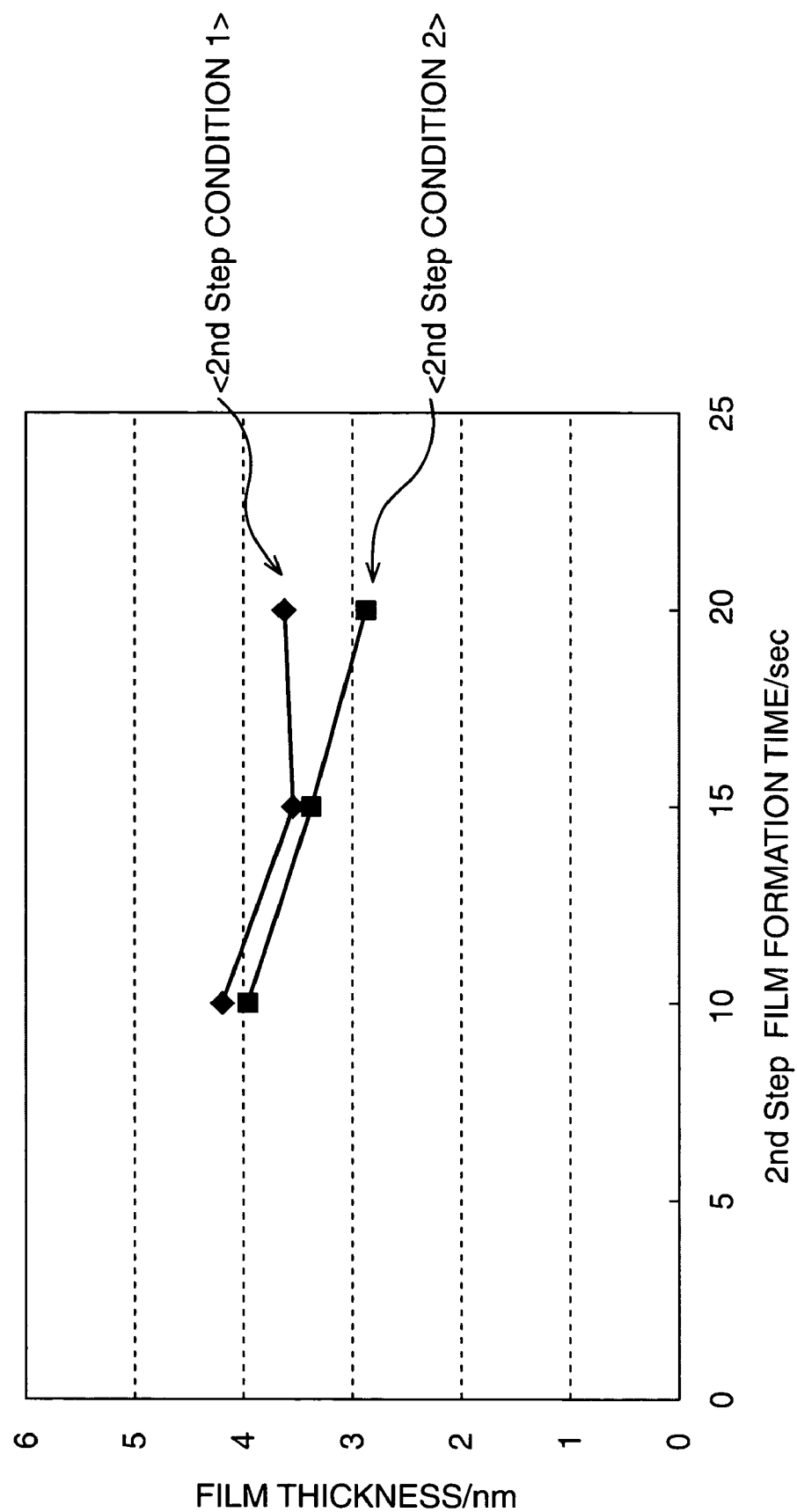

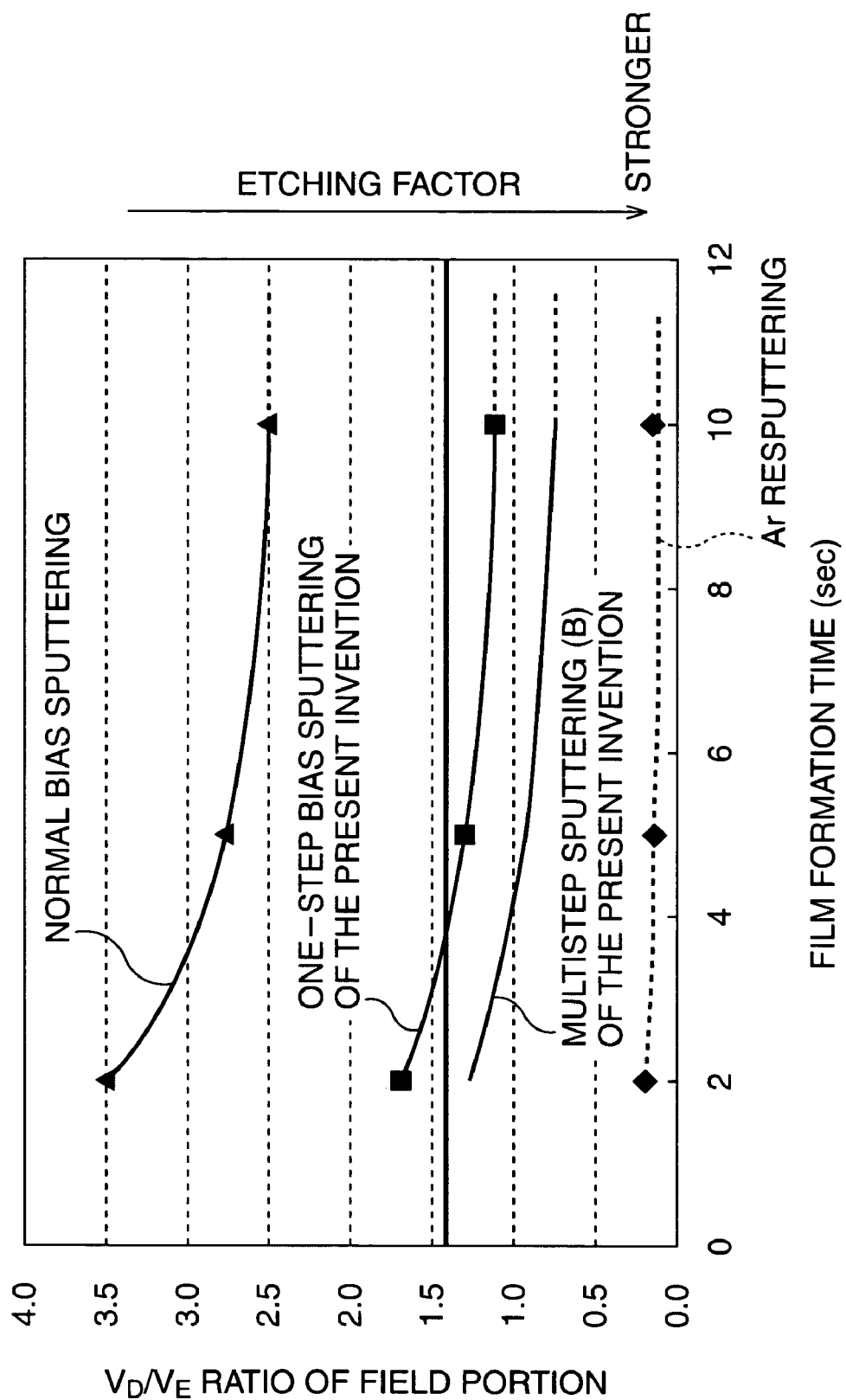

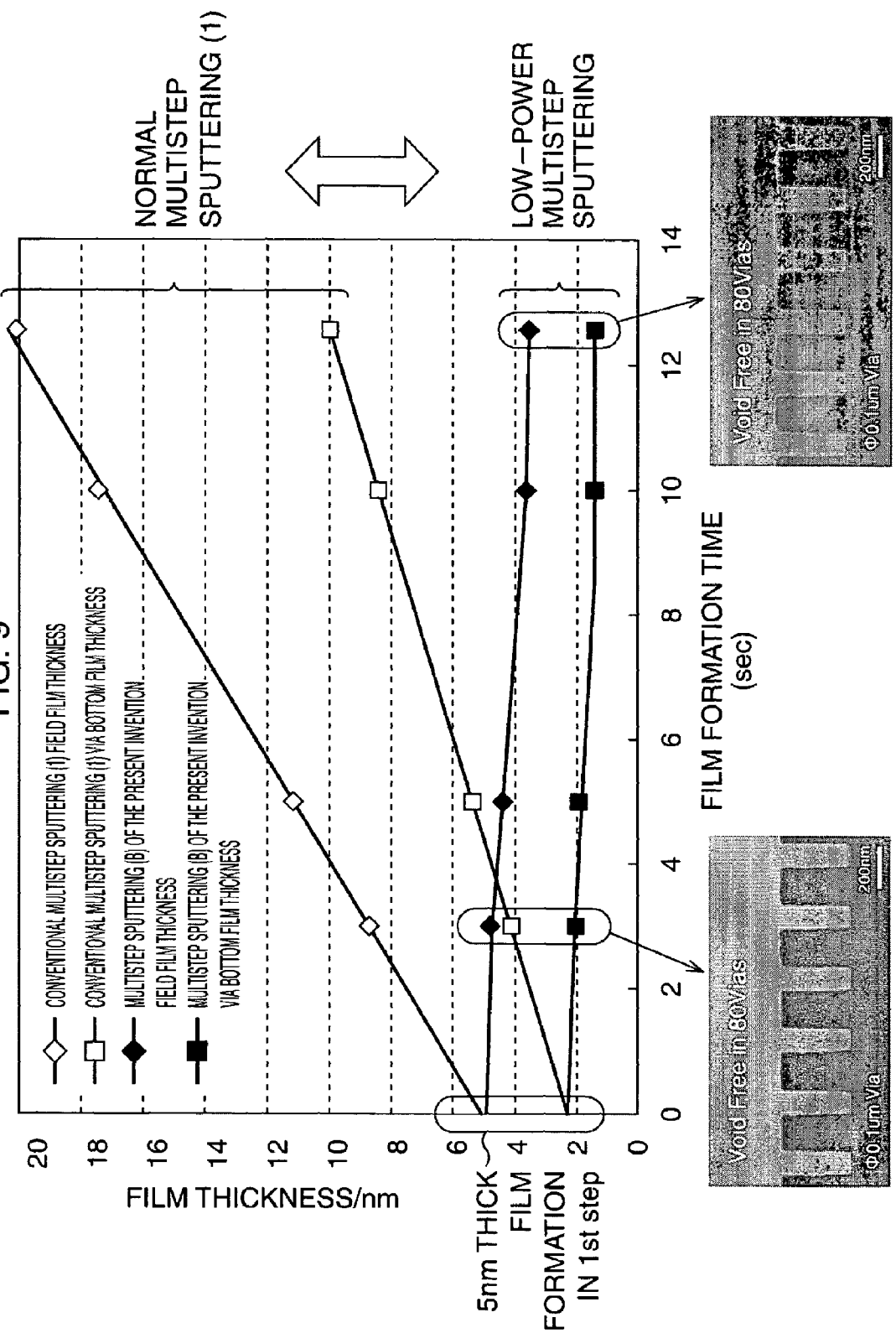

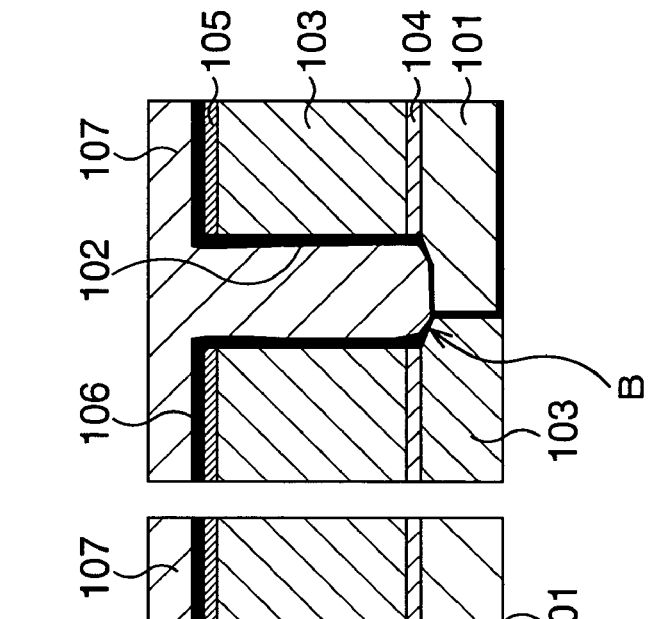
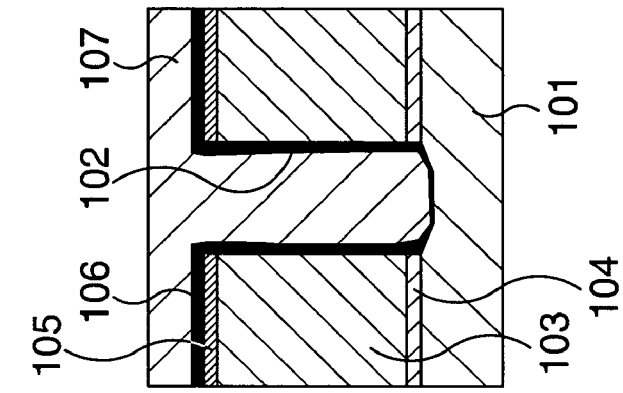
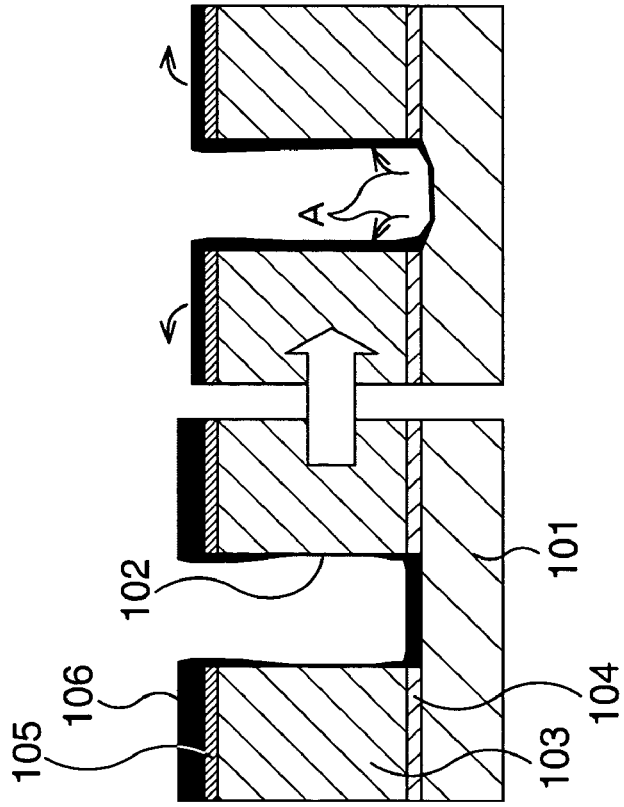

WIRING STRUCTURE FORMING METHOD AND SEMICONDUCTOR DEVICE

This application is a continuation of international application PCT/JP2005/000191 filed on Jan. 11, 2005.

TECHNICAL FIELD

The present invention relates to a wiring structure forming method in which a conductive material is embedded in an opening formed in an insulating film over a substrate, and a semiconductor device, and particularly it is technology suitable for application to a so-called damascene method in which Cu wiring is formed with an opening as a minute wiring trench or connection hole and with Cu (alloy) as a conductive material.

BACKGROUND ART

With high integration of a semiconductor element and a reduction in chip size, finer wiring and multilayered wiring are acceleratingly promoted. In a logic device having such a multilayer wiring structure, wiring delay is becoming one of factors governing device signal delay. The device signal delay is proportional to the product of wiring resistance and wiring capacity, and hence, to improve wiring delay, reductions in wiring resistance and wiring capacity are important.

To reduce the wiring resistance, the formation of wiring with Cu which is low-resistance metal as a material is studied. Since it is very difficult to form wiring by patterning Cu, a so-called damascene method in which an opening which becomes a wiring trench or a connection hole (via hole) is formed in an insulating film and filled with Cu to form the wiring is worked out.

When Cu wiring is formed by the damascene method, a step of forming a base film which covers an inner wall of the opening before Cu is deposited is included, mainly in order to prevent Cu from diffusing into the insulating film. Refractory metal such as Ta or W used as a material for the base film is generally high resistant, but in recent years when finer wiring is promoted, it is indispensable to reduce the resistance value of the base film from a matter of wiring resistance. In particular, in the case of an ultra-fine wiring layer containing a via hole with a diameter of 0.1 μm and a wiring with a width of 0.1 μm, it is necessary to thin the base film as much as possible in order to reduce wiring resistance and contact resistance, and hence the technology for forming a base film thin and uniformly over an inner wall of a wiring trench or a via hole is desired.

A CVD method is first thought of as a method for forming such a base film. As far as the formation of the thin and uniform base film is concerned, it is thought that the use of the CVD method is advantageous, but the CVD method has a big problem in compatibility with and adhesiveness to a low dielectric constant insulating material which is expected as a material for the insulating film in which the opening is formed, and the application of this method is difficult in the present circumstances. A sputtering method is superior in the aforementioned compatibility and adhesiveness to the CVD method, whereby the use of the sputtering method for the formation of the base film is considered to be suitable.

At present, as sputtering technology used for forming the base film, there are a long throw sputtering method in which the distance between a substrate and a target is set longer than normal, a bias sputtering method in which a film is formed while a bias voltage is applied to a substrate, a multistep sputtering method in which two or more steps of sputtering as a combination of sputter deposition and sputter etching are performed, and so on.

However, under the present circumstances, even if the aforementioned various sputtering methods are used, the base film cannot be formed thin and uniformly over an inner wall surface, that is, from a side wall surface to a bottom surface, of the wiring trench or the via hole.

Specifically, part of a process of forming wiring containing a base film is shown in FIG. 1A to FIG. 3.

Here, for example, when a via hole 102 to connect a lower wiring 101 and an upper wiring not shown is formed in an interlayer insulating film 103 using an etching stopper film 104 and a hard mask 105, a Ta base film 106 is formed over the interlayer insulating film 103 so as to cover an inner wall of the via hole 102 by a sputtering method, and thereafter Cu 107 is deposited so as to be embedded in the via hole 102 by a plating method. Here, FIG. 1A shows a case where a long throw sputtering method is used as the sputtering method when the base film 106 is formed, FIG. 1B shows a case where a bias sputtering method is used, FIG. 2 shows a case where a multistep sputtering method (1) is used, and FIG. 3 shows a case where a multistep sputtering method (2) is used.

The Case of the Long Throw Sputtering Method

In the example of FIG. 1A, when a semiconductor substrate with a diameter of 200 mm is used, the method is carried out under the condition that the target power is between 10 kW and 20 kW, the pressure is $4 \times 10^{-2}$ Pa, and the substrate bias power is between 0 W and 300 W. When a semiconductor substrate with a diameter of 300 mm is used, the method is carried out under the condition that the target power is between 20 kW and 40 kW, the pressure is $4 \times 10^{-2}$ Pa, and the substrate bias power is between 0 W and 500 W.

In this case, Ta is thickly deposited over a bottom portion of the via hole 102 and a portion (field portion) other than the via hole 102 of the interlayer insulating film 103, whereas scarce Ta is deposited over a sidewall surface of the via hole 102, and as a result, due to insufficient coverage of the sidewall surface, poor embedding, for example, a void 108 occurs in the Cu 107 formed by plating.

The Case of the Bias Sputtering Method

In the example of FIG. 1B, when a semiconductor substrate with a diameter of 200 mm is used, the method is carried out under the condition that the target power is between 10 kW and 25 kW, the pressure is $4 \times 10^{-2}$ Pa, and the substrate bias power is between 300 W and 600 W. When a semiconductor substrate with a diameter of 300 mm is used, the method is carried out under the condition that the target power is between 20 kW and 40 kW, the pressure is $4 \times 10^{-2}$ Pa, and the substrate bias power is between 500 W and 1200 W.

In this case, excessive Ta is deposited not only over the bottom surface of the via hole 102 but also in the vicinity of a rim portion of the via hole 102 (a so-called overhang is formed). This causes poor embedding, for example, the void 108 on the side wall surface of the via hole 102 and a seam 109 in the vicinity of the entrance of the via hole 102 to the Cu 107.

The Case of the Multistep Sputtering Method (1)

In the example of FIG. 2, when a semiconductor substrate with a diameter of 200 mm is used, in a first step, long throw sputtering is carried out under the condition that the target power is between 10 kW and 25 kW, the pressure is $4 \times 10^{-2}$ Pa, and the substrate bias power is between 0 W and 300 W, and in a second step, bias sputtering is carried out under the condition that the target power is between 10 kW and 25 kW, the pressure is $4\times10^{-2}$ Pa, and the substrate bias power is between 300 W and 600 W. When a semiconductor substrate with a diameter of 300 mm is used, in a first step, long throw sputtering is carried out under the condition that the target power is between 20 kW and 40 kW, the pressure is $4\times10^{-2}$ Pa, and the substrate bias power is between 0 W and 500 W, and in a second step, bias sputtering is carried out under the condition that the target power is between 20 kW and 40 kW, the pressure is $4\times10^{-2}$ Pa, and the substrate bias power is between 500 W and 1200 W.

In this case, a portion over the bottom surface of the via hole 102 of the base film 106 is formed thick and the embedding property of Cu is relatively good, but an overhang caused by excessive deposition of Ta in the vicinity of the rim portion of the via hole 102 is formed, and thereby the thickness of the base film 106 becomes nonuniform.

The Case of the Multistep Sputtering Method (2)

In the example of FIG. 3, when a semiconductor substrate with a diameter of 200 mm is used, in a first step, long throw sputtering is carried out under the condition that the target power is between 10 kW and 25 kW, the pressure is $4\times10^{-2}$ Pa, and the substrate bias power is between 0 W and 300 W, and in a second step, Ar resputtering is carried out under the condition that the target power is between 0.1 kW and 0.4 kW, the pressure is $4\times10^{-2}$ Pa, and the substrate bias power is between 300 W and 600 W. When a semiconductor substrate with a diameter of 300 mm is used, in a first step, long throw sputtering is carried out under the condition that the target power is between 20 kW and 40 kW, the pressure is $4\times10^{-2}$ Pa, and the substrate bias power is between 0 W and 500 W, and in a second step, Ar resputtering is carried out under the condition that the target power is between 0.1 kW and 0.5 kW, the pressure is $4\times10^{-2}$ Pa, and the substrate bias power is between 500 W and 1200 W.

As shown by the arrows A, Ta deposited over the bottom surface of the via hole 102 in the first step adheres again to a side surface of the via hole 102 to make up a shortage of Ta over the side surface in the second step, but as shown by the arrow B, if an etching factor is strong, Ta becomes insufficient over the bottom surface of the via hole 102, which brings about a state in which hardly any Ta is deposited over the bottom surface. When positional displacement occurs between the lower wiring 101 and the via hole 102 due to this, for example, Cu deposited by plating diffuses into the interlayer insulating film 103. Furthermore, the seam 109 occurs in the vicinity of the entrance of the via hole 102 because of the formation of the overhang caused by the excessive deposition of Ta in the vicinity of the rim portion of the via hole 102.

The comparison of field portion film thicknesses, sidewall surface coverages, overhangs, via hole bottom surfaces, and embedding properties among the aforementioned long throw sputtering method, bias sputtering method, and multistep sputtering methods (1) and (2) will be shown in the following Table 1.

TABLE 1

|  | Field Film Thickness | Sidewall Coverage | Overhang | Via Bottom | Embedding Property |
|---|---|---|---|---|---|
| Long Throw Sputtering | Thick | Thin | Small | Thick | Sidewall Void Tends to Occur |
| One-step Bias sputtering | Thick | Slightly Thin | Slightly Large | Slightly Thin | Seam/Side Wall Void Occur |

TABLE 1-continued

|  | Field Film Thickness | Sidewall Coverage | Overhang | Via Bottom | Embedding Property |
|---|---|---|---|---|---|
| Multistep sputtering (1) | Thick | Slightly Thick | Slightly Large | Thick | Relatively Good Embedding |
| Multistep Sputtering (2) | Thin | Thick | Large | Almost Nothing | Seam Tends to Occur |

Even if the various sputtering methods are used as just described, it is very difficult to form the basic film with a uniform film thickness in the opening. There is also a disadvantage that to control the film forming state of the base film, the multistep method with three or more steps needs to be adopted, which causes complication of a film forming process thereof, resulting in an increase in the time required for the process. This causes an increase in target power consumption, an increase in particles produced at the time of film formation, and a deterioration in throughput, which leads to a considerably thick deposition over the field portion while the necessary amount of film is formed in the opening. The base film deposited over the field portion needs to be removed by polishing in a chemical mechanical polishing (CMP) process, but the base film too thick leads to a deterioration in throughput in the CMP process and furthermore exerts a bad influence on the capability of the entire manufacturing line. Moreover, CMP of the base film has mechanical polishing as a strong factor, and hence flaws such as scratches tend to occur, which may contribute to a reduction in the yield of wiring formation.

(Patent Document 1)

Japanese Patent Application No. 2002-318674

SUMMARY OF THE INVENTION

The present invention is made in view of the aforementioned problems, and its object is to provide a wiring structure forming method which makes it possible to form a base film thin and uniformly over an inner wall surface, that is, from a sidewall surface to a bottom surface, of an opening without causing any disadvantage in terms of wiring formation by relatively simple steps to realize a highly reliable ultra-fine wiring structure, and a semiconductor device.

A wiring structure forming method of the present invention comprises the steps of: forming an opening in an insulating film over a substrate; forming a base film over the insulating film in such a manner that the base film covers an inner wall surface of the opening by a sputtering method; removing the base film over the insulating film other than that in the opening in such a manner that the base film remains only over the inner wall surface of the opening; and embedding a conductive material in the opening with the base film therebetween, and the base film is formed in such a manner that a film thickness thereof in a portion other than the opening over the insulating film is equal to or less than 1/20 of a diameter of the opening.

In an aspect of the wiring structure forming method of the present invention, the base film is formed in such a manner that a film thickness thereof in a portion other than the opening over the insulating film is equal to or less than 1/30 of a diameter of the opening.

In an aspect of the wiring structure forming method of the present invention, the base film is formed in such a manner that a film thickness thereof over a bottom surface of the inner wall surface of the opening is not less than 20% nor more than 100% of a film thickness in a portion other than the opening over the insulating film.

In an aspect of the wiring structure forming method of the present invention, the base film is formed by the sputtering method under a condition of $$1 < Vd/Ve < 2$$

where Vd/Ve is a ratio of a deposition rate (Vd) of a material for the base film to an etching rate (Ve) thereof.

In an aspect of the wiring structure forming method of the present invention, the base film is formed so as to cover only the inner wall surface of the opening and not to be deposited over the insulating film other than that in the opening.

In an aspect of the wiring structure forming method of the present invention, the base film is formed under a condition that a target power density is within a range from 3 mW/mm$^2$ to 160 mW/mm$^2$ and a substrate bias power density is within a range from 3 mW/mm$^2$ to 14 mW/mm$^2$.

In an aspect of the wiring structure forming method of the present invention, the base film is formed by plural sputtering steps comprising:
  a first sputtering step under a condition of Vd/Ve>1; and
  a second sputtering step under a condition of Vd/Ve<1 where Vd/Ve is a ratio of a deposition rate (Vd) of a material for the base film to an etching rate (Ve) thereof.

In an aspect of the wiring structure forming method of the present invention, when the base film is formed, a bias voltage is applied to the substrate.

In an aspect of the wiring structure forming method of the present invention, the base film is formed under a condition that a pressure of an atmosphere of sputtering ion species is not less than $1\times10^{-2}$ Pa nor more than $1\times10^{-1}$ Pa.

In an aspect of the wiring structure forming method of the present invention, the conductive material is copper or a conductive substance containing copper.

In an aspect of the wiring structure forming method of the present invention, wherein a material for the base film is at least one type selected from the group consisting of Ta (tantalum), Ti (titanium), W (tungsten), Zr (zirconium), and V (vanadium) or a nitride containing the at least one type.

A wiring structure forming method of the present invention comprises the steps of: forming an opening in an insulating film over a substrate; forming a base film over the insulating film in such a manner that the base film covers an inner wall surface of the opening by a sputtering method; and embedding a conductive material in the opening with the base film therebetween, and the step of forming the base film comprises:
  a first sputtering step under a condition of Vd/Ve>1; and
  a second sputtering step under a condition of Vd/Ve<1.4 where Vd/Ve is a ratio of a deposition rate (Vd) of a material for the base film to an etching rate (Ve) thereof.

In an aspect of the wiring structure forming method of the present invention, the second sputtering step is carried out under a condition that a target power density is within a range from 10 mW/mm$^2$ to 160 mW/mm$^2$ and a substrate bias power density is within a range from 3 mW/mm$^2$ to 20 mW/mm$^2$.

A wiring structure forming method of the present invention comprises the steps of: forming an opening in an insulating film over a substrate; forming a base film in such a manner that the base film covers only an inner wall surface of the opening and is not deposited over the insulating film other than that in the opening by a sputtering method; and embedding a conductive material in the opening with the base film therebetween.

A semiconductor device of the present invention comprises: a semiconductor substrate; an insulating film formed over the semiconductor substrate; a base film which covers only an inner wall surface of the opening; and a conductive material which is embedded in the opening with the base film therebetween, and the base film is a sputtered film covering the inner wall surface at a uniform film thickness.

In an aspect of the semiconductor device of the present invention, the base film is formed by a sputtering method under a condition of $$1 < Vd/Ve < 2$$

where Vd/Ve is a ratio of a deposition rate (Vd) of a material for the base film to an etching rate (Ve) thereof.

In an aspect of the semiconductor device of the present invention, the base film is formed by plural sputtering steps comprising:
  a first sputtering step under a condition of Vd/Ve>1; and
  a second sputtering step under a condition of Vd/Ve<1 where Vd/Ve is a ratio of a deposition rate (Vd) of a material for the base film to an etching rate (Ve) thereof.

A semiconductor device of the present invention is manufactured by various steps comprising the steps of: forming an opening in an insulating film over a substrate; forming a base film over the insulating film in such a manner that the base film covers an inner wall surface of the opening by a sputtering method; and embedding a conductive material in the opening with the base film therebetween, and the step of forming the base film comprises:
  a first sputtering step under a condition of Vd/Ve>1; and
  a second sputtering step under a condition of Vd/Ve<1.4 where Vd/Ve is a ratio of a deposition rate (Vd) of a material for the base film to an etching rate (Ve) thereof.

A semiconductor device of the present invention is manufactured by various steps comprising the steps of: forming an opening in an insulating film over a substrate; forming a base film in such a manner that the base film covers only an inner wall surface of the opening and is not deposited over the insulating film other than that in the opening by a sputtering method; and embedding a conductive material in the opening with the base film therebetween.

BRIEF DESCRIPTION OF THE DRAWINGS

FIG. 2 is a schematic sectional view showing a case where a conventional multistep sputtering method (1) is used;

FIG. 3 is a schematic sectional view showing a case where a conventional multistep sputtering method (2) is used;

FIG. 7 is a characteristic chart showing film thickness in a field portion of a base film when the base film with a uniform film thickness is formed by multistep sputtering (A) of the present invention;

FIG. 8 is a characteristic chart showing the quantitative relation between film formation time and a ratio (Vd/Ve) of a deposition rate (field portion) (Vd) of sputtering particles and etching rate (Ve) thereof using a semiconductor substrate with a diameter of 200 mm in multistep sputtering (B) of the present invention;

FIG. 9 is a characteristic chart showing the results of investigations of the relation between film formation time and film thickness inside and outside a via hole with a diameter of 0.1 μm using the semiconductor substrate with the diameter of 200 mm in the multistep sputtering (B) of the present invention;

FIG. 11A is a schematic sectional view showing a state in which a base film is formed by the multistep sputtering (B) of the present invention;

FIG. 11B is a schematic sectional view showing a state in which the base film is formed by the multistep sputtering (B) of the present invention;

FIG. 11C is a schematic sectional view showing a state in which the base film is formed by the multistep sputtering (B) of the present invention;

DETAILED DESCRIPTION OF THE PREFERRED EMBODIMENTS

Basic Gist of the Present Invention

As described above, various conventional sputtering methods have a tendency to aim at realization of a base film with a thin and uniform film thickness by adding a film forming condition to a sputtering process or increasing the process and making the process more elaborate, for example, the application of a bias to a substrate or sputtering divided into plural steps. However, in the present circumstances, this inevitably causes the complication of the process, and moreover uniformity of the base film over the entire inner wall surface of an opening is not obtained. The present inventor changes his point of view from the aforementioned tendency to addition of the condition to the sputtering process to a microscopic state of sputtering, that is, a microscopic film forming state woven by a balance between deposition of sputtering particles and etching thereof in the sputtering process, quantifies this microscopic state, and pays attention to the correlation between this microscopic state and the film forming state of the entire base film.

(One-step Bias Sputtering)

The present inventor thinks that if, in the sputtering process, the sputtering condition is set so that the ratio of the deposition rate of sputtering particles to the etching rate thereof is within a certain range throughout the sputtering process, the thin and uniform base film can be formed over the entire inner wall surface of the opening even by one-step sputtering, and investigates the relation between film formation time and this ratio with a bias sputtering method as an example.

Figure 1A:
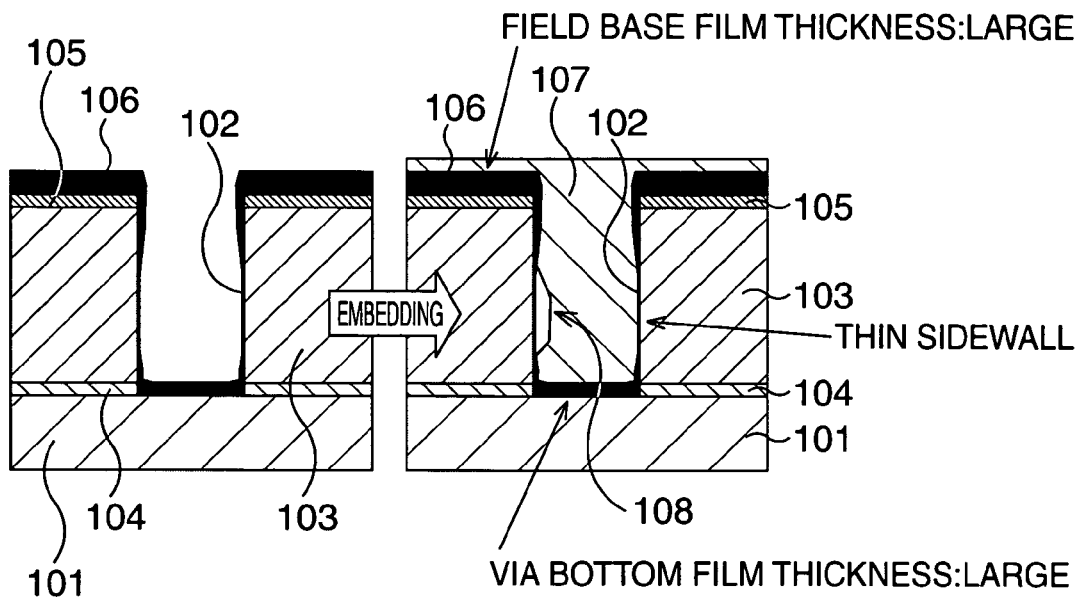
FIG. 1A is a schematic sectional view showing a case where a conventional long throw sputtering method is used.
Figure 1B:
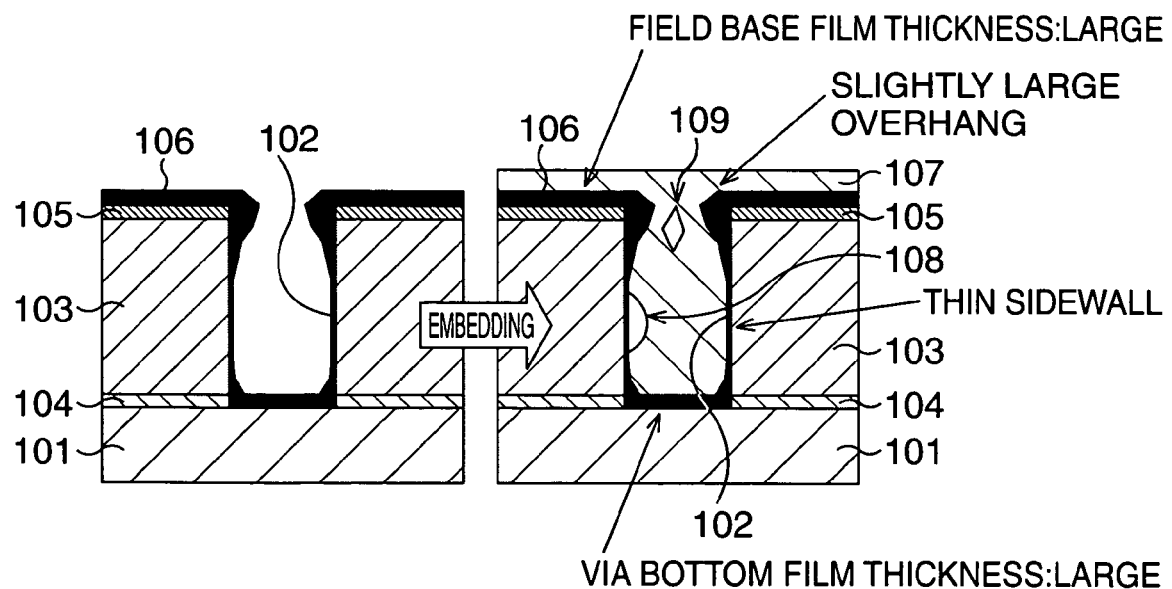
FIG. 1B is a schematic sectional view showing a case where a conventional bias sputtering method is used.
Figure 4:
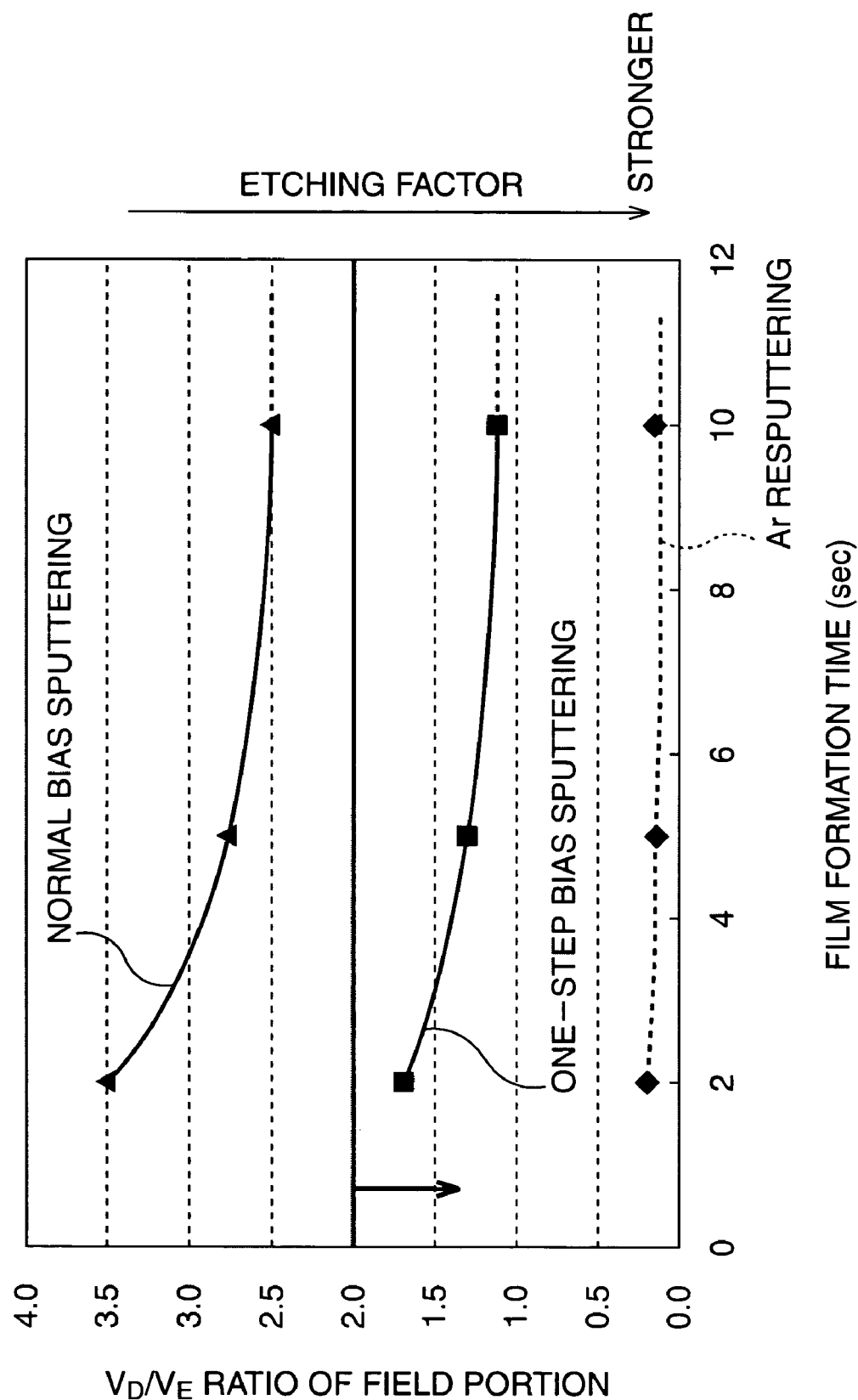
FIG. 4 is a characteristic chart showing the quantitative relation between film formation time and a ratio (Vd/Ve) of a deposition rate (Vd) of sputtering particles and an etching rate (Ve) thereof in a one-step bias sputtering process of the present invention.

FIG. 4 is a characteristic chart showing the quantitative relation between film formation time and a ratio (Vd/Ve) of a deposition rate (field portion) (Vd) of sputtering particles and an etching rate (Ve) thereof using a semiconductor substrate with a diameter of 200 mm in a one-step bias sputtering process of the present invention. Here, normal bias sputtering is carried out under the condition that the target power is 10 kW, the pressure is $4\times10^{-2}$ Pa, and the substrate bias is 200 W, and Ar resputtering is carried out under the condition that the target power is 0.3 kW, the pressure is between $3\times10^{-1}$ Pa and $7\times10^{-1}$ Pa, and the substrate bias power is 300 W.

In a general bias sputtering method, the film is usually formed in the range of a Vd/Ve ratio of 2.5 or more to maintain a certain degree of film forming rate. In this range of Vd/Ve, the proportion of deposition is higher than that of etching, whereby the resputtering effect is small. In this case, to ensure the coverage of a sidewall portion of the inner wall of the opening, it is necessary to increase the film formation time and substrate bias power, but this causes adverse effects such as an increase in overhang, an increase in particles when the film is formed, and difficulty in reducing the thickness of the film.

In Ar resputtering in a multistep sputtering method, to strengthen an etching factor, the range of a Vd/Ve ratio less than 1 (for example, approximately 0.75) is often selected. In this range, the contribution of Ta ions as a material for the base film is small, and the etching effect by Ar ions is large, whereby film formation progresses in a state in which a film material is hardly deposited. This etching effect tends to increase as the pressure at the time of film formation (pressure of an Ar atmosphere) becomes higher, and film peeling in a rim portion of the opening and film peeling in a bottom portion of the opening increase, whereby there arises the high possibility of causing failures such as Cu diffusion into an insulating film caused by a wiring short-circuit and positional displacement of the opening, respectively.

As a result of forming the base film by the one-step bias sputtering within the range of a Vd/Ve ratio not less than 1 nor more than 2.5, the present inventor finds that if the ratio is controlled to be 1<Vd/Ve<2 throughout the formation of the film, the thin and uniform base film over the entire inner wall surface of the opening is obtained. Namely, in this case, the supply of Ta ions and resputtering by Ta ions are balanced, local etching in the rim portion and the bottom portion of the opening is prevented, and a certain amount of Ta is ensured even on the bottom portion. Moreover, reinforcement of the film thickness on the sidewall of the opening by the resputtering effect moderately progresses, and as a result, the thin and uniform base film over the entire inner wall surface of the opening is obtained.

Here, to obtain $1<Vd/Ve<2$ throughout the formation of the film, it is suitable to carry out the one-step bias sputtering of the present invention under the condition that the target power is a relatively low power between 0.1 kW and 5.0 kW, the atmosphere pressure of plasma generating gas (Ar in this case) is between $1\times10^{-2}$ Pa and $1\times10^{-1}$ Pa, and the substrate bias power is between 100 W and 450 W when a semiconductor substrate with a diameter of 200 mm is used, and in the one-step bias sputtering of the present invention, the target power is set to 5 kW, the pressure is set to $6\times10^{-2}$ Pa, and the substrate bias power is set to 300 W.

The values of the target power and the substrate bias power depend on the size of the semiconductor substrate. To obtain conditions independent of the size of the semiconductor substrate, it is recommended to adopt the condition per unit area, that is, a value obtained by dividing the condition of a semiconductor substrate with each diameter by the area of the semiconductor substrate. Accordingly, it is suitable to carry out the one-step bias sputtering of the present invention under the condition that the target power density is within a range from 3 mW/mm$^2$ to 160 mW/mm$^2$ and the substrate bias power density is within a range from 3 mW/mm$^2$ to 14 mW/mm$^2$ as the condition per unit area to obtain $1<Vd/Ve<2$ throughout the formation of the film.

As described above, in the present invention, a desired base film shape is attained by a smaller sputtering amount than in prior arts by low power in the one-step bias sputtering, and as a result, effects such as reductions in wiring resistance and contact resistance, a reduction in target power consumption, an increase in throughput, and a reduction in particles at the time of film formation are produced.

Moreover, the present inventor compares a film thickness over the bottom portion of a via hole of the base film and a film thickness over the field portion under the sputtering condition which satisfies $1<Vd/Ve<2$ throughout film formation.

Figure 5:
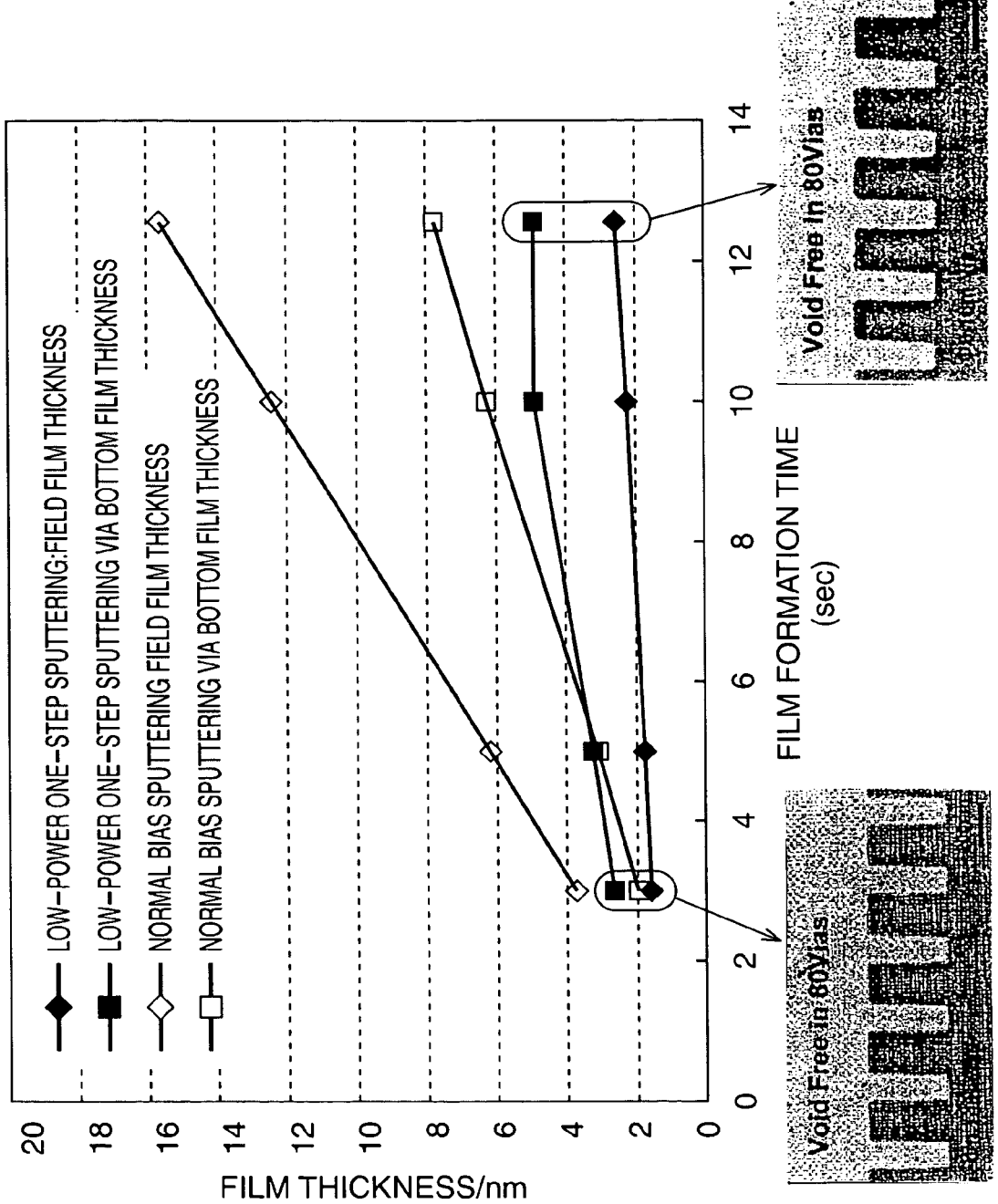
FIG. 5 is a characteristic chart showing the results of investigations of the relation between film formation time and film thickness inside and outside a via hole with a diameter of 0.1 μm in the one-step bias sputtering process of the present invention.

FIG. 5 is a characteristic chart showing the results of investigations of the relation between film formation time and film thickness inside and outside a via hole with a diameter of 0.1 μm in the one-step bias sputtering process of the present invention. Here, the normal bias sputtering is carried out under the condition that the target power is 10 kW, the pressure is $4\times10^{-2}$ Pa, and the substrate bias power is 200 W, and the one-step bias sputtering of the present invention is carried out under the condition that the target power is 5 kW, the pressure is $6\times10^{-2}$ Pa, and the substrate bias power is 300 W.

In the general bias sputtering method, the film thickness of the base film over the field portion is larger than that over the bottom portion of the via hole, and over both the field portion and the bottom portion of the via hole, the film thickness increases with increase in film formation time. In contrast, it turns out that in the present invention, the film thickness of the base film over the bottom portion of the via hole is formed larger than that over the field portion, an increase in film thickness over the field portion with the passage of film formation time is slight, and that the film thickness over the field portion is smaller than 5 nm, and kept here below 3 nm. In other words, this means that the film thickness of the base film over the field portion is equal to or less than 1/20, more preferably 1/30 of the diameter (0.1 μm in this case) of the via hole. Moreover, it means that the film thickness of the base film over the field portion is 20% to 100% of the film thickness over the bottom portion of the via hole, and approximately 20% in this case. Further, it is confirmed that the state of embedding of Cu in the via hole in this film formation range is satisfactory.

As an example, photographs by a SEM showing states in which Cu is embedded in the via hole when the film formation time is approximately 3 seconds and approximately 12.5 seconds in the one-step bias sputtering of the present invention are shown in the lower portion of FIG. 5. As shown, it can be seen that Cu is embedded without causing any void and any seam in the via hole.

Furthermore, the present inventor thinks out that according to the aforementioned experimental results, under a predetermined sputtering condition satisfying $1<Vd/Ve<2$, the thin and uniform base film is formed only over the entire inner wall surface of the via hole, and in a portion over the insulating film other than that in the opening, that is, in the field portion, the supply of Ta ions and resputtering by Ta ions are nearly equal, so that a state in which the deposition amount of Ta ions becomes zero is obtained. In this case, only Cu over the field portion is required to be removed by polishing in a CMP process subsequent to Cu deposition, which can reduce a polishing process of the base film.

Figure 6A:
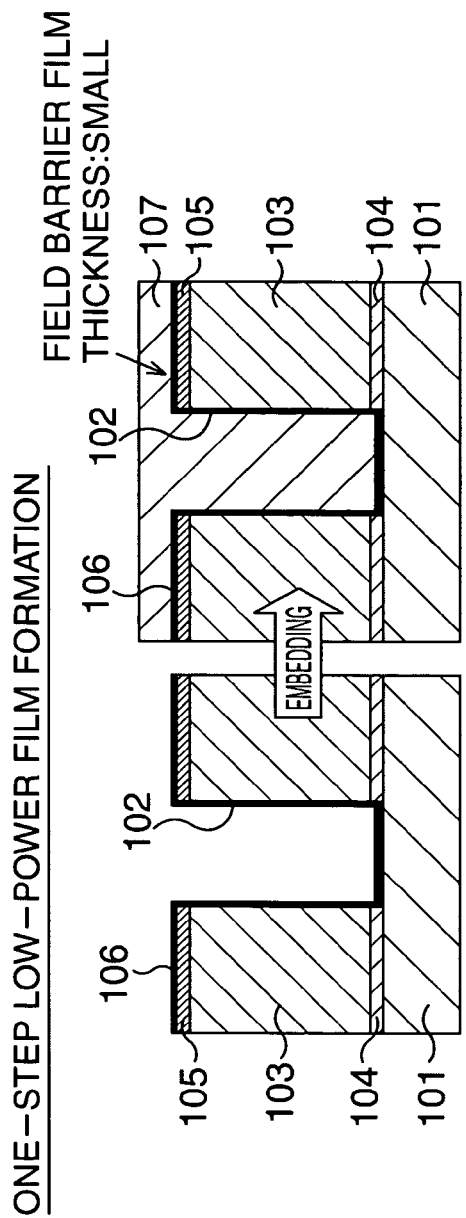
FIG. 6A is a schematic sectional view showing a state in which a base film is formed by the one-step bias sputtering method of the present invention.
Figure 6B:
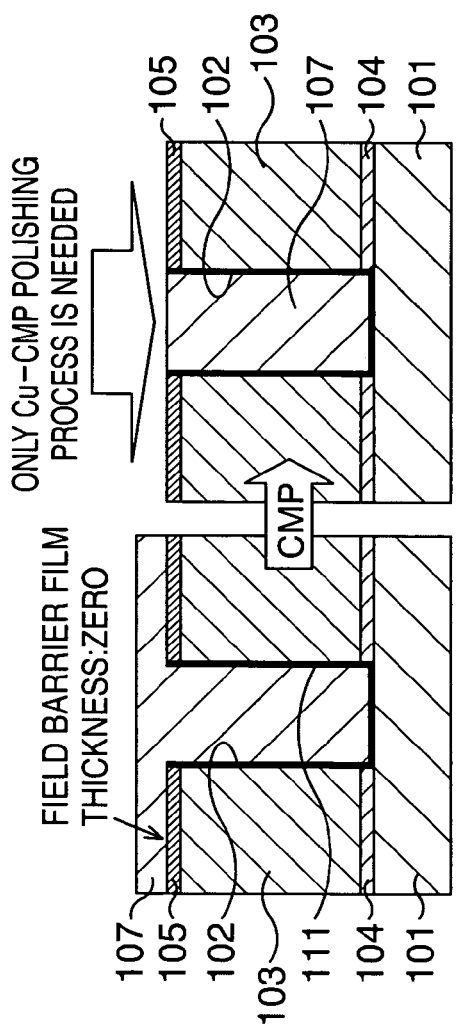
FIG. 6B is a schematic sectional view showing a state in which the base film is formed by the one-step bias sputtering of the present invention.

Specifically, a state in which the base film is formed by the one-step bias sputtering method of the present invention is shown in FIG. 6A and FIG. 6B.

As shown in FIG. 6A, after, using a semiconductor substrate with a diameter of 200 mm, a via hole 102 with a diameter of approximately 0.1 μm to connect a lower wiring 101 and an upper wiring not shown is formed in an interlayer insulating film 103 using an etching stopper film 104 and a hard mask 105, a base film 106 made from Ta is formed over the interlayer insulating film 103 so as to cover an inner wall of the via hole 102 by the one-step low-power bias sputtering method of the present invention. As the sputtering condition, the target power is between 0.1 kW and 5 kW, the pressure is between $4\times10^{-2}$ Pa and $8\times10^{-2}$ Pa, and the substrate bias power is between 150 W and 450 W. An organic/inorganic SOG film or an organic/inorganic CVD film with a film thickness of approximately a few hundreds of nm as the interlayer insulating film 103, and a SiO+SiC-based film with a film thickness of approximately a few tens of nm as the hard mask 105 are formed respectively. Thus, the base film 106 with a thin and uniform film thickness covering a region from an inner wall surface of the via hole 102 to the interlayer insulating film 103 is obtained. Thereafter, Cu 107 is deposited so as to be embedded in the via hole 102 by a plating method. Any void and the like do not occur in the via hole 102 and so on even if the Cu 107 is embedded, leading to the realization of satisfactory Cu deposition.

Moreover, as shown in FIG. 6B, by selecting the sputtering condition within the range satisfying $1<Vd/Ve<2$, it is possible that the base film 106 with the thin and uniform thickness is formed so as to cover only the inner wall of the via hole 102 without Ta being deposited over the field portion. Here, in order that only the via hole 102 is filled with the Cu 107 after the Cu 107 is deposited so as to be embedded in the via hole 102, in the example of FIG. 6A, it is necessary to remove the Cu 107 and the base film 106 over the field portion in sequence by polishing by the CMP method, but in the example of FIG. 6B, since the base film 106 does not exist over the field portion, only the Cu 107 over the field portion is required to be removed by polishing by the CMP method, whereby the CMP process of the base film 106 can be reduced.

(Multistep Sputtering (A))

In the present invention, also by multistep sputtering other than the aforementioned one-step bias sputtering, it is possible that the base film with a thin and uniform thickness is formed over the inner wall surface of the opening, and that the film thickness over the field portion is formed to be equal to or less than 1/20 (more preferably equal to or less than 1/30) of the diameter of the opening.

FIG. 7 is a characteristic chart showing the film thickness over the field portion of the base film when the base film (Ta film in this case) with a uniform film thickness is formed by multistep sputtering (A) of the present invention.

A first step (long throw (low-bias) sputtering) is carried out under the sputtering condition which satisfies Vd/Ve>1, here, under the condition that the target power is 10 kW, the pressure is between $4 \times 10^{-2}$ Pa and $8 \times 10^{-2}$ Pa, and the substrate bias power is between 0 W and 200 W so that the base film with a film thickness approximately between 5 nm and 10 nm can be obtained.

A second step (low-power resputtering) is carried out under the sputtering condition which satisfies Vd/Ve<1, here, under the condition that the target power is 2.5 kW, the pressure is between $4 \times 10^{-2}$ Pa and $8 \times 10^{-2}$ Pa, and the substrate bias power is 300 W (condition 1) or under the condition that the target power is 0.5 kW, the pressure is between $4 \times 10^{-2}$ Pa and $8 \times 10^{-2}$ Pa, and the substrate bias power is 200 W (condition 2). In the condition 1, Vd/Ve is approximately between 0.8 and 0.9, and in the condition 2, Vd/Ve is approximately between 0.5 and 0.7.

By carrying out a two-step bias sputtering method as just described, the base film with a thin and uniform film thickness is formed over the inner wall surface of the via hole, and the film thickness over the filed portion is kept below 5 nm, and hence it turns out that an effect equal to that by the one-step bias sputtering method of the present invention can be obtained.

(Multistep Sputtering (B))

The present inventor finds that according to the multistep sputtering, the deposition rate of the base film material over the bottom portion of the via hole is ensured larger than an originally estimated value at the time of low-power resputtering in the second step. Accordingly, the present inventor comes to think that in this case, it is not always necessary to set the film thickness over the field portion to 1/20 or less of the diameter of the opening, and the range of the etching rate in the second step can be extended, more specifically, to Vd/Ve<1.4.

FIG. 8 is a characteristic chart showing the quantitative relation between film formation time and a ratio (Vd/Ve) of a deposition rate (field portion) (Vd) of sputtering particles and an etching rate (Ve) thereof using a semiconductor substrate with a diameter of 200 mm in multistep sputtering (B) of the present invention.

Here, part of FIG. 8 is the same as FIG. 4, and the normal bias sputtering, the Ar resputtering, and the one-step bias sputtering of the present invention correspond to those in FIG. 4. FIG. 8 further shows the aforementioned quantitative relation in the multistep sputtering (B) of the present invention.

Here, in the multistep sputtering (B) of the present invention, a first step (long throw (low-bias) sputtering) is carried out under the sputtering condition which satisfies Vd/Ve>1, here, under the condition that the target power is 10 kW, the pressure is between $4 \times 10^{-2}$ Pa and $8 \times 10^{-2}$ Pa, and the substrate bias power is between 0 W and 200 W so that the base film with a film thickness approximately between 5 nm and 10 nm can be obtained, and a second step (low-power resputtering) is carried out under the sputtering condition which satisfies Vd/Ve<1.4, here, under the condition that the target power is 2 kW, the pressure is between $6 \times 10^{-2}$ Pa, and the substrate bias power is 250 W.

In the second step, by selecting the condition which satisfies Vd/Ve<1.4 in the field portion, the base film material over the bottom portion of the via hole can be resputtered effectively as described later.

The present inventor compares the film thickness of the base film over the bottom portion of the via hole and the film thickness thereof over the field portion using a semiconductor substrate with a diameter of 200 mm under the sputtering conditions which satisfy Vd/Ve>1 in the first step and Vd/Ve<1.4 in the second step, respectively in the multistep sputtering (B).

FIG. 9 is a characteristic chart showing the results of investigations of the relation between film formation time and film thickness inside and outside a via hole with a diameter of 0.1 mm using the semiconductor substrate with the diameter of 200 mm in the process of the multistep sputtering (B) of the present invention. Here, as normal multistep sputtering (1), in a first step, long throw sputtering is carried out under the condition that the base film is formed with a film thickness of 5 nm, and in a second step, bias sputtering is carried out under the condition that the target power is 10 kW, the pressure is $4 \times 10^{-2}$ Pa, and the substrate bias power is 200 W.

On the other hand, as the multistep sputtering (B) of the present invention, in a first step, long throw sputtering is carried out under the condition that the base film is formed with a film thickness of 5 nm, and in a second step, low-power resputtering is carried out under the condition that the target power is 2 kW, the pressure is $6 \times 10^{-2}$ Pa, and the substrate bias power is 250 W.

In the general bias sputtering method, over both the field portion and the bottom portion of the via hole, the film thickness increases with increase in film formation time. In contrast, in the present invention, with the passage of film formation time, the film thickness over the field portion reduces or slightly increases, so that the film thickness over the field portion is kept below 5 nm. Moreover, it turns out that in this case, the film thickness over the bottom portion of the via hole is maintained at an almost constant value of approximately 2 nm independently of the film formation time. It is thought that this is because in the multistep sputtering (B) of the present invention, unlike the normal multistep sputtering (2), when in the second step, by etching the base film material, for example, Ta deposited over the bottom portion of the via hole in the first step, Ta scattered by this etching is made to adhere to the sidewall surface of the via hole, Ta over the bottom portion is etched mainly by Ta ions instead of Ar ions, and as a result, Ta remains over the bottom portion.

As an example, photographs by the SEM showing states in which Cu is embedded in the via hole when the film formation time in the second step is approximately 3 seconds and approximately 12.5 seconds in the multistep sputtering (B) of the present invention are shown in the lower portion of FIG. 9. As shown, it can be seen that Cu is embedded without causing any void and any seam in the via hole.

In addition to the results in FIG. 9, the via resistance value when Vd/Ve in the second step of the multistep sputtering (B) of the present invention is changed is examined. If the via resistance value is small, it is conceivable that this is equivalent to the fact that the base film is formed with a sufficient film thickness over the inner wall of the via hole.

Figure 10:
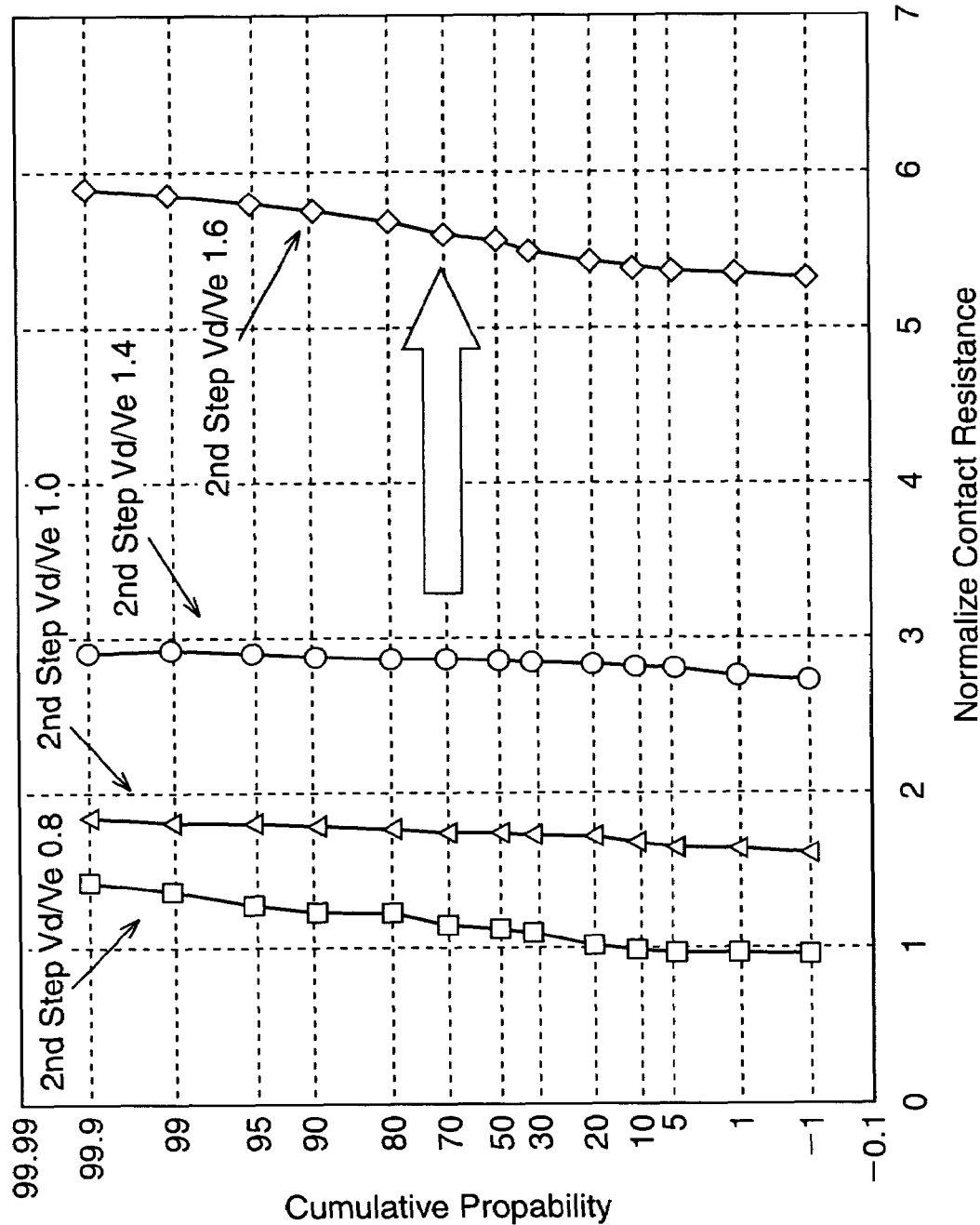
FIG. 10 is a characteristic chart showing the results of investigations of the via resistance value when Vd/Ve in a second step in the multistep sputtering (B) of the present invention is changed.

Experimental results are shown in FIG. 10. Here, the horizontal axis represents the via resistance relative value, and the vertical axis represents the cumulative probability.

As shown in FIG. 10, as Vd/Ve in the second step is reduced to 1.4, 1.0, and 0.8, the via resistance value gradually reduces, and the via resistance value is held relatively at a small value. In contrast, it is conceivable that in the case of Vd/Ve=1.6 beyond Vd/Ve=1.4, the via resistance value increases to a via resistance almost twice as high as the resistance value in the case of Vd/Ve=1.4, and that the via resistance value relatively exceeds an allowable range. Also from this result, it turns out that Vd/Ve<1.4 in the second step makes it possible to form the base film with a sufficient film thickness over the inner wall of the via hole.

Now, respective conditions to obtain Vd/Ve<1.4 in the second step of the multistep sputtering (B) of the present invention will be studied.

The following table 2 shows an example of target power and substrate bias power to obtain Vd/Ve<1.4 regarding semiconductor substrates with diameters of 200 mm and 300 mm. To obtain Vd/Ve<1.4 in the second step, also based on results in Table 2, the second step is required to be carried out under the condition that the target power density is within a range from 10 mW/mm$^2$ to 160 mW/mm$^2$, and the substrate bias power density is within a range from 3 mW/mm$^2$ to 20 mW/mm$^2$ as respective conditions per unit area of the semiconductor substrate.

TABLE 2

A type 200 mm → DC0.5-4 kW, RF200-600 W
B type 200 mm → DC0.3-3.5 kW, RF200-350 W
A type 300 mm → DC2-8 kW, RF300-1200 W
B type 300 mm → DC3-6 kW, RF800-1400 W More specifically, FIG. 11A and FIG. 11B each show a state in which the base film is formed by the multistep sputtering (B) of the present invention.

As shown in FIG. 11A, after using a semiconductor substrate with a diameter of 200 mm, the via hole 102 with a diameter of approximately 0.1 μm to connect the lower wiring 101 and the upper wiring not shown is formed in the interlayer insulating film 103 using the etching stopper film 104 and the hard mask 105, the base film 106 made from Ta is formed over the interlayer insulating film 103 so as to cover the inner wall of the via hole 102 by the multistep sputtering (B) of the present invention.

An organic/inorganic SOG film or an organic/inorganic CVD film with a film thickness of approximately a few hundreds of nm as the interlayer insulating film 103, and a SiO+SiC-based film with a film thickness of approximately a few tens of nm as the hard mask 105 are formed respectively.

As the sputtering condition, the first step (long throw (low-bias) sputtering) is carried out under the sputtering condition which satisfies Vd/Ve>1, here, under the condition that the target power is 10 kW, the pressure is between $4 \times 10^{-2}$ Pa and $8 \times 10^{-2}$ Pa, and the substrate bias power is between 0 W and 200 W so that the base film with a film thickness approximately between 5 nm and 10 nm can be obtained, and the second step (low-power resputtering) is carried out under the sputtering condition which satisfies Vd/Ve<1.4, here, under the condition that the target power is 2 kW, the pressure is between $6 \times 10^{-2}$ Pa, and the substrate bias power is 250 W.

When in the second step, by etching Ta deposited over the bottom portion of the via hole 102 in the first step, Ta scattered by this etching, for example, as shown by the arrows A is made to adhere to the sidewall surface of the via hole 102, Ta over the bottom portion is etched mainly by Ta ions, and as a result, Ta remains over the bottom portion. Moreover, the etching is performed by relatively heavy Ta, the etching efficiency is excellent, and peeling of the rim portion of the via hole 102 and an overhang of Ta thereof can be reduced. By this sputtering, the base film 106 with a thin and uniform film thickness covering a region from the inner wall surface of the via hole 102 to the insulating film 103 is obtained.

Thereafter, the Cu 107 is deposited so as to be embedded in the via hole 102 by the plating method.

In this case, even if the Cu 107 is embedded, satisfactory Cu deposition is realized without causing any void and the like in the via hole 102 and so on. Moreover, as shown in FIG. 11C, even if positional displacement occurs between the lower wiring 101 and the via hole 102, the thin base film 106 remains over the bottom portion of the via hole 106 as shown by the arrow B, which inhibits Cu deposited by plating into the interlayer insulating film 103.

The following table 3 shows the field portion film thickness, sidewall surface coverage, overhang, via hole bottom surface, and embedding property according to the aforementioned multistep sputtering (B) of the present invention.

TABLE 3

| | Field Film Thickness | Sidewall Coverage | Overhang | Via Bottom | Embedding Property |
|---|---|---|---|---|---|
| Multistep Sputtering (B) | Thin | Thick | Small | Thin | Satisfactory Embedding Amount |

Specific Embodiment of the Present Invention

A specific embodiment in which the present invention is applied to the formation of Cu wiring (and via connection) by a damascene method will be explained below.

FIG. 12A to FIG. 13C are schematic sectional views showing a wiring forming method according to this embodiment in the order of steps.

Figure 12A:
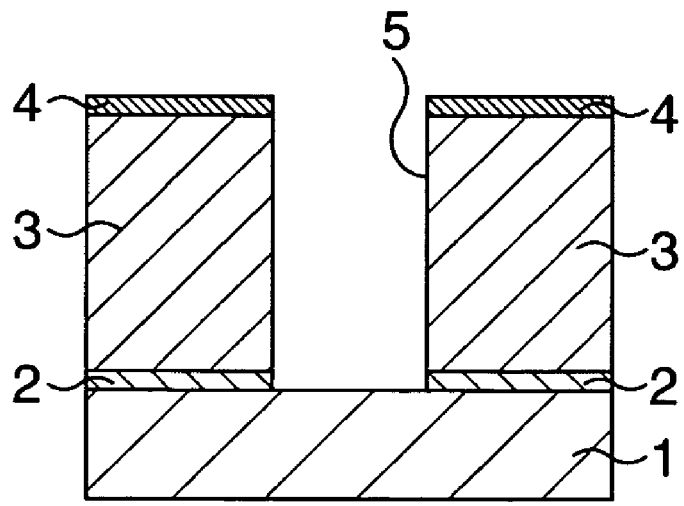
FIG. 12A is a schematic sectional view showing a wiring forming method according to an embodiment in the order of steps.

First, as shown in FIG. 12A, after a semiconductor element such as a MOS transistor is formed on a semiconductor substrate not shown, a lower wiring 1 is formed to be connected to the semiconductor element. Subsequently, an etching stopper film 2 with a film thickness of a few tens of nm is formed over the lower wiring 1, for example, using SiO+SiC, and thereafter, an interlayer insulating film 3 with a film thickness of a few hundreds of nm is formed over the etching stopper film 2 using an organic or inorganic insulating material by an SOG method or a CVD method. Then, after a hard mask 4 having an opening is formed over the interlayer insulating film 3, for example, by using the SiO+SiC, a via hole 5 with a diameter approximately between 0.1 μm and 0.15 μm and a depth approximately between 300 nm and 700 nm is formed in the interlayer insulating film 3 by dry etching also with the hard mask 4. CF-based gas, NH$_3$-based gas, or N$_2$/H$_2$ gas is used as etching gas. At this time, an opening is also formed in the etching stopper film 2, and the surface of the lower wiring 1 is exposed from a bottom surface of the via hole 5.

Figure 12B:
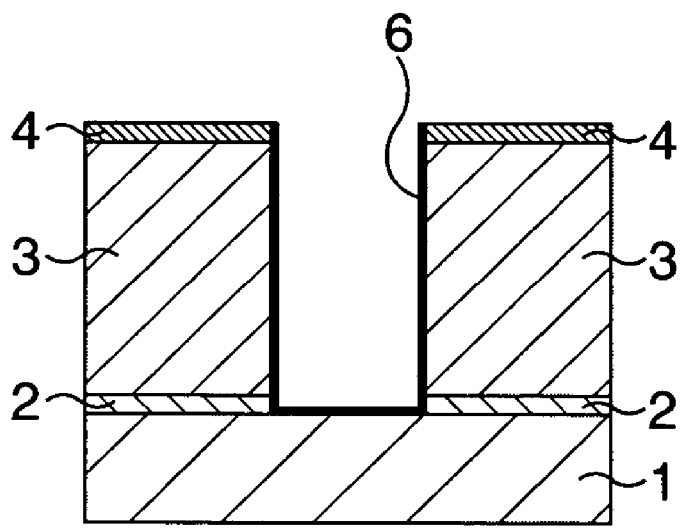
FIG. 12B is a schematic sectional view showing the wiring forming method according to the embodiment in the order of steps.

Subsequently, as shown in FIG. 12B, one-step bias sputtering is carried out under the sputtering condition which satisfies 1<Vd/Ve<2 and under which a film material is not deposited over a field portion, and here the target power is between 0.2 kW and 5 kW, the pressure is $4 \times 10^{-2}$ Pa, and the substrate bias power is between 150 W and 450 W. By performing sputtering with Ta (or TaN) as a material under this condition, Ta is (hardly) deposited over the interlayer insulating film 3 (field portion) other than that in the via hole 5 but deposited only over an inner wall surface of the via hole 5, and a base film 6 with a uniform film thickness of 5 nm or less is formed. It is also possible here to use at least one type of refractory metal selected from Ti, W, Zr, and V or a nitride of these metals in place of Ta as a sputtering material. Moreover, it is defined that a preliminary step of this film forming step includes an electric discharge starting step, an electric discharge stabilizing step, an electric discharge completing step, and a substrate electricity removing step. Incidentally, there is a possibility that the substrate electricity removing step is not included.

Figure 13A:
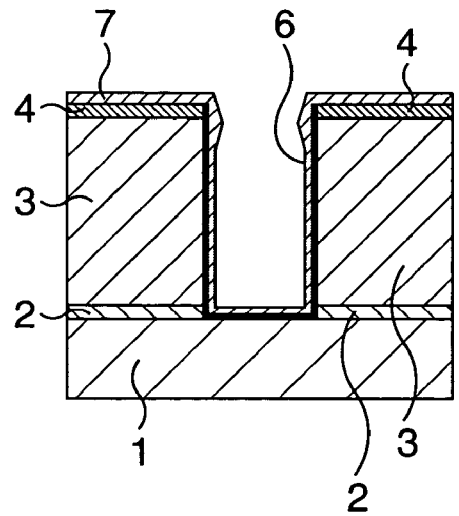
FIG. 13A is a schematic sectional view showing the wiring forming method according to the embodiment in the order of steps.

Thereafter, as shown in FIG. 13A, a seed metal film 7 is formed with Cu as a material over the interlayer insulating film 3 by sputtering so as to cover the inner wall surface of the via hole 5 with the base film 6 between them. The seed metal film 7 with a film thickness approximately between 40 nm and 150 nm is formed under the sputtering condition that the target power is between 5 kW and 30 kW, the pressure is between $1 \times 10^5$ Pa and 10 Pa, and the substrate bias power is between 200 W and 500 W. Here, it is also possible to use a Cu alloy containing Al, Ti, Zr, Ni, Ag, Pd, and so on in place of Cu as a material for the seed metal film 7.

Figure 13B:
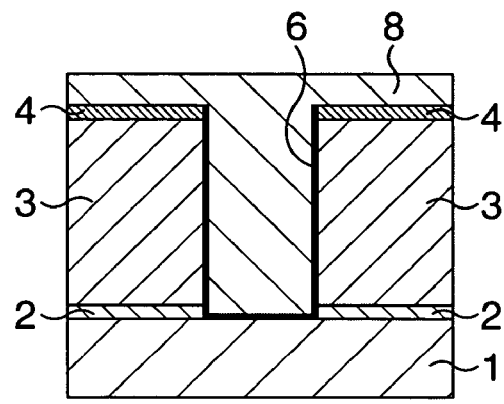
FIG. 13B is a schematic sectional view showing the wiring forming method according to the embodiment in the order of steps.

Subsequently, as shown in FIG. 13B, Cu 8 is embedded in a wiring trench 12 by the plating method with the seed metal film 7 as an electrode. On this occasion, the Cu 8 with a film thickness approximately between 500 nm and 2000 nm is deposited at a current density between 7 A/cm$^2$ and 30 A/cm$^2$ with a copper sulfate bath.

Figure 13C:
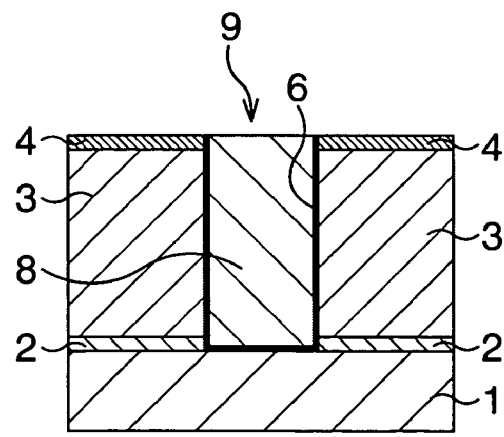
FIG. 13C is a schematic sectional view showing the wiring forming method according to the embodiment in the order of steps.

Then, as shown in FIG. 13C, a surface layer of the Cu 8 is removed by polishing by the CMP method with an organic acid slurry solution and, for example, the hard mask 4 as a stopper, and a via-plug 9 which is made by filling the via hole 5 with the Cu 8 with the base film 6 therebetween is formed. At this time, Ta of the base film 6 does not exist over the field portion, whereby only polishing of the Cu 8 is needed.

Thereafter, a wiring structure is completed through the formation of another interlayer insulating film not shown and an upper wiring not shown which is connected to the via-plug 9.

Incidentally, also when the lower wiring 1 is formed, it is also possible to form a base film which thin and uniformly covers an inner wall of a wiring trench formed in an insulating film by sputtering technology of the present invention and embed Cu in this wiring trench with the base film therebetween by a damascene method.

Moreover, in this embodiment, the case where the sputtering technology of the present invention is used for the formation of the base film of the via-plug in the damascene method is shown as an example, but the present invention is not limited to this case, and, for example, it is also possible that the present invention is applied to a dual damascene method, and that a base film with a thin and uniform film thickness is formed by the aforementioned sputtering method so as to cover the inner wall surface from a via hole to a wiring trench and at the same time Cu is embedded in the via hole and the wiring trench to thereby form a wiring structure.

As explained above, according to this embodiment, it becomes possible to form the base film 6 thin and uniformly over an inner wall surface, that is, from a sidewall surface to a bottom surface, of an opening, here, the via hole 5 without causing any disadvantage in terms of wiring formation by relatively simple steps, and improvements in wiring resistance and contact resistance, lowering of load and a reduction in the CMP process, a reduction in target power consumption, an increase in throughput, a reduction in particles at the time of film formation, an increase in wiring performance, and an increase in manufacturing line capability are attained to thereby realize a highly reliable ultra-fine wiring structure.

INDUSTRIAL APPLICABILITY

According to the present invention, it becomes possible to form a base film thin and uniformly over an inner wall surface, that is, from a sidewall surface to a bottom surface, of an opening without causing any disadvantage in terms of wiring formation by relatively simple steps, and improvements in wiring resistance and contact resistance, lowering of load and a reduction in the CMP process, a reduction in target power consumption, an increase in throughput, a reduction in particles at the time of film formation, an increase in wiring performance, and an increase in manufacturing line capability are attained to thereby realize a highly reliable ultra-fine wiring structure.

What is claimed is:

1. A wiring structure forming method, comprising the steps of:
   forming an opening in an insulating film over a substrate;
   forming a base film over the insulating film in such a manner that the base film covers an inner wall surface of the opening by a sputtering method;
   removing the base film over the insulating film other than that in the opening in such a manner that the base film remains only over the inner wall surface of the opening; and
   embedding a conductive material in the opening with the base film therebetween, wherein
   the base film is formed in such a manner that a film thickness thereof in a portion other than the opening over the insulating film is equal to or less than 1/20 of a diameter of the opening.

2. The wiring structure forming method according to claim 1, wherein the base film is formed in such a manner that a film thickness thereof in a portion other than the opening over the insulating film is equal to or less than 1/30 of a diameter of the opening.

3. The wiring structure forming method according to claim 1, wherein the base film is formed in such a manner that a film thickness thereof over a bottom surface of the inner wall surface of the opening is not less than 20% nor more than 100% of a film thickness in a portion other than the opening over the insulating film.

4. The wiring structure forming method according to claim 1, wherein the base film is formed by the sputtering method under a condition of $$1 < Vd/Ve < 2$$

where Vd/Ve is a ratio of a deposition rate (Vd) of a material for the base film to an etching rate (Ve) thereof.

5. The wiring structure forming method according to claim 4, wherein the base film is formed so as to cover only the inner wall surface of the opening and not to be deposited over the insulating film other than that in the opening.

6. The wiring structure forming method according to claim 4, wherein the base film is formed under a condition that a target power density is within a range from 3 mW/mm$^2$ to 160 mW/mm² and a substrate bias power density is within a range from 3 mW/mm² to 14 mW/mm².

7. The wiring structure forming method according to claim 1, wherein the base film is formed by plural sputtering steps comprising:
a first sputtering step under a condition of Vd/Ve>1; and
a second sputtering step under a condition of Vd/Ve<1
where Vd/Ve is a ratio of a deposition rate (Vd) of a material for the base film to an etching rate (Ve) thereof.

8. The wiring structure forming method according to claim 1, wherein when the base film is formed, a bias voltage is applied to the substrate.

9. The wiring structure forming method according to claim 1, wherein the base film is formed under a condition that a pressure of an atmosphere of sputtering ion species is not less than $1\times10^{-2}$ Pa nor more than $1\times10^{-1}$ Pa.

10. The wiring structure forming method according to claim 1, wherein the conductive material is copper or a conductive substance containing copper.

11. The wiring structure forming method according to claim 1, wherein a material for the base film is at least one type selected from the group consisting of Ta (tantalum), Ti (titanium), W (tungsten), Zr (zirconium), and V (vanadium) or a nitride containing the at least one type.

12. A wiring structure forming method, comprising the steps of:
forming an opening in an insulating film over a substrate;
forming a base film over the insulating film in such a manner that the base film covers an inner wall surface of the opening by a sputtering method; and
embedding a conductive material in the opening with the base film therebetween, wherein
said step of forming the base film comprises:
a first sputtering step under a condition of Vd/Ve>1; and
a second sputtering step under a condition of Vd/Ve<1.4
where Vd/Ve is a ratio of a deposition rate (Vd) of a material for the base film to an etching rate (Ve) thereof.

13. The wiring structure forming method according to claim 12, wherein said second sputtering step is carried out under a condition that a target power density is within a range from 10 mW/mm² to 160 mW/mm² and a substrate bias power density is within a range from 3 mW/mm² to 20 mW/mm².

14. A semiconductor device, wherein
said semiconductor device is manufactured by various steps comprising the steps of:
forming an opening in an insulating film over a substrate;
forming a base film over the insulating film in such a manner that the base film covers an inner wall surface of the opening by a sputtering method; and
embedding a conductive material in the opening with the base film therebetween, and
said step of forming the base film comprises:
a first sputtering step under a condition of Vd/Ve>1; and
a second sputtering step under a condition of Vd/Ve<1.4
where Vd/Ve is a ratio of a deposition rate (Vd) of a material for the base film to an etching rate (Ve) thereof.

15. A wiring structure forming method, comprising the steps of:
forming an opening in an insulating film over a substrate;
forming a base film in such a manner that the base film covers only an inner wall surface of the opening and is not deposited over the insulating film other than that in the opening by a sputtering method; and
embedding a conductive material in the opening with the base film therebetween,
wherein said base film is formed by a sputtering method under a condition of 1<Vd/Ve<2, where Vd/Ve is a ratio of a deposition rate (Vd) of a material for said base film to an etching rate (Ve) thereof.

16. A wiring structure forming method, comprising the steps of:
forming an opening in an insulating film over a substrate;
forming a base film in such a manner that the base film covers only an inner wall surface of the opening and is not deposited over the insulating film other than that in the opening by a sputtering method; and
embedding a conductive material in the opening with the base film therebetween,
wherein said base film is formed by plural sputtering steps including:
a first sputtering step under a condition of Vd/Ve>1, and
a second sputtering step under a condition of Vd/Ve<1,
where Vd/Ve is a ratio of a deposition rate (Vd) of a material for said base film to an etching rate (Ve) thereof.

* * * * *